United States Patent
Choi et al.

(10) Patent No.: US 9,230,801 B2
(45) Date of Patent: Jan. 5, 2016

(54) GRAPHENE STRUCTURE AND METHOD OF FABRICATING THE SAME

(75) Inventors: Byoung-Iyong Choi, Seoul (KR); Eun-kyung Lee, Seoul (KR); Dong-mok Whang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/229,183

(22) Filed: Sep. 9, 2011

(65) Prior Publication Data

US 2012/0141700 A1 Jun. 7, 2012

(30) Foreign Application Priority Data

Dec. 7, 2010 (KR) ........................ 10-2010-0124233

(51) Int. Cl.
*B32B 9/00* (2006.01)
*H01L 21/02* (2006.01)
*C01B 31/04* (2006.01)

(52) U.S. Cl.
CPC ...... *H01L 21/02381* (2013.01); *C01B 31/0438* (2013.01); *H01L 21/0245* (2013.01); *H01L 21/0259* (2013.01); *H01L 21/02428* (2013.01); *H01L 21/02444* (2013.01); *H01L 21/02502* (2013.01); *H01L 21/02505* (2013.01); *H01L 21/02527* (2013.01); *H01L 21/02606* (2013.01); *H01L 21/02664* (2013.01); *Y10T 428/13* (2015.01); *Y10T 428/24273* (2015.01); *Y10T 428/24479* (2015.01); *Y10T 428/30* (2015.01)

(58) Field of Classification Search
CPC ........................ C01B 31/0483; C01B 2204/00

USPC ............ 428/408; 423/448; 977/742; 252/501
See application file for complete search history.

(56) References Cited

U.S. PATENT DOCUMENTS

| | | | |
|---|---|---|---|
| 8,075,950 B2 * | 12/2011 | Choi et al. | 427/221 |
| 8,679,976 B2 * | 3/2014 | Lee et al. | 438/680 |
| 2007/0247049 A1 * | 10/2007 | Li et al. | 313/311 |
| 2009/0068470 A1 * | 3/2009 | Choi et al. | 428/403 |
| 2010/0051960 A1 | 3/2010 | Chen et al. | |
| 2010/0055388 A1 | 3/2010 | Chen et al. | |
| 2010/0085713 A1 * | 4/2010 | Balandin et al. | 361/705 |
| 2010/0206363 A1 | 8/2010 | Choi | |
| 2011/0111227 A1 * | 5/2011 | Crocker et al. | 428/392 |
| 2011/0114894 A1 | 5/2011 | Choi et al. | |

(Continued)

FOREIGN PATENT DOCUMENTS

| | | |
|---|---|---|
| CN | 101723349 A | 6/2010 |
| CN | 102782856 A | 11/2012 |

(Continued)

OTHER PUBLICATIONS

Pandurangan et al.: "Single-step synthesis of germanium nanowires encapsulated within multi-walled carbon nanotubes"; Carbon, vol. 47, No. 7, pp. 1708-1714; Mar. 2009; xp026020181.

(Continued)

*Primary Examiner* — Daniel H Miller
(74) *Attorney, Agent, or Firm* — Harness, Dickey & Pierce, P.L.C.

(57) ABSTRACT

A graphene structure and a method of forming the same may include a graphene formed in a three-dimensional (3D) shape, e.g., a column shape, a stacking structure, and a three-dimensionally connected structure. The graphene structure can be formed by using Ge.

15 Claims, 18 Drawing Sheets

(56) References Cited

U.S. PATENT DOCUMENTS

| | | |
|---|---|---|
| 2011/0215300 A1 | 9/2011 | Guo et al. |
| 2011/0253983 A1 | 10/2011 | Chen et al. |
| 2012/0003438 A1* | 1/2012 | Appleton et al. .......... 428/195.1 |
| 2012/0295423 A1 | 11/2012 | Guo et al. |

FOREIGN PATENT DOCUMENTS

| | | |
|---|---|---|
| CN | 103140439 A | 6/2013 |
| EP | 2327661 A1 | 6/2011 |
| JP | 2005-314162 A | 11/2005 |
| JP | 2005-330151 A | 12/2005 |
| JP | 5-311444 B2 | 11/2013 |
| KR | 20090017454 A | 2/2009 |
| KR | 2010-0001062 A | 1/2010 |
| KR | 2010-0023638 A | 3/2010 |
| KR | 2010-0093965 A | 8/2010 |
| KR | 1020110109680 A | 10/2011 |
| WO | WO-2010/022164 A1 | 2/2010 |
| WO | WO-2010/023934 A1 | 3/2010 |
| WO | WO-2011112300 A1 | 9/2011 |

OTHER PUBLICATIONS

European Search Report dated Feb. 20, 2014 for corresponding European application No. 11 189 558.7.

Chinese Office Action dated Oct. 29, 2014 issued in corresponding Chinese Application No. 201110389290.X.

Pandurangan, et al. "Single-step synthesis of germanium nanowires encapsulated within multi-walled carbon nanotubes", ScienceDirect Carbon 47, pp. 1708-1714 (2009).

Pandurangan, et al. "Single-step synthesis of germanium nanowires encapsulated within multi-walled carbon nanontubes", Carbon, vol. 47, pp. 1708-1714 (2009).

Japanese Office Action dated Jun. 16, 2015 issued in corresponding Japanese Patent Application No. 2011-211036.

* cited by examiner

GRAPHENE STRUCTURE AND METHOD OF FABRICATING THE SAME

CROSS-REFERENCE TO RELATED APPLICATIONS

This application claims the benefit of Korean Patent Application No. 10-2010-0124233, filed on Dec. 7, 2010, in the Korean Intellectual Property Office (KIPO), the entire contents of which are incorporated herein by reference.

BACKGROUND

1. Field

Example embodiments relate to a graphene structure and a method of fabricating the same, and more particularly, to a graphene structure having various structures and methods of fabricating the same.

2. Description of the Related Art

Graphene is a two-dimensional (2D) thin film having a honey-comb structure formed of one-atom-layer carbon. Carbon atoms form a carbon hexagonal plane having a 2D-bond structure with a $sp^2$-hybrid orbital, and a composite of carbon atoms having the planar structure is referred to as graphene.

There are various methods of forming graphene including a mechanical exfoliation method, a chemical exfoliation method, a SiC thermal treatment method, a chemical vapor deposition (CVD) method, an epitaxial synthetic method, and an organic synthetic method, and furthermore, minute patterning of graphene using a lithography process has been proposed. Because graphene has very useful characteristics that are different from those of existing materials, various studies have been conducted to apply graphene to electronic devices.

SUMMARY

Example embodiments provide a graphene structure having various three-dimensional (3D) shapes formed of graphene and a method of forming the graphene structure having various 3D shapes. Additional aspects will be set forth in part in the description which follows and, in part, will be apparent from the description, or may be learned by practice of example embodiments.

According to example embodiments, a graphene structure may include a graphene structure may include a template having a three-dimensional (3D) shape, and a graphene configured to cover at least a portion of an outer circumference of the template.

The template may have a rod shape and the graphene may be configured to surround the outer circumference of the template. The template may be at least one of a nanowire and a nanorod. The template may be formed of germanium (Ge) or may include a Ge coating on a surface thereof.

According to example embodiments, a graphene structure may include graphene formed in a hollow tube.

According to example embodiments, a graphene structure may include a first supporting layer, a first graphene on the first supporting layer, a second supporting layer on the first graphene and a second graphene on the second supporting layer.

The first and second supporting layers may be formed of Ge or may include a Ge coating on upper surfaces thereof. At least one of the first graphene and the second graphene may be patterned. The graphene structure may further include a third supporting layer on the second graphene, and a third graphene on the third supporting layer to form a multi-layer graphene structure. The multi-layer graphene structure may include a plurality of holes therein.

According to example embodiments, a graphene structure may include a first graphene, a second graphene separated from a surface of the first graphene in a perpendicular direction, and a third graphene configured to cross the first graphene and the second graphene and support the first graphene and the second graphene.

According to example embodiments, a method of forming a graphene structure may include placing a three dimensional template in a reaction chamber, the template including at least a surface formed of a first germanium (Ge) layer, and growing a first graphene along an outer circumference of the first Ge layer by supplying a carbon containing gas into the reaction chamber.

The template may have a rod shape. The template may be the first Ge layer, and may be removed after forming the first graphene. The template may be formed of a non-Ge material, and the first Ge layer may be formed on at least a portion of the template.

The first Ge layer may be removed after forming the first graphene. The first Ge layer may be formed according to a pattern and the first graphene may be grown along the pattern of the Ge layer.

The method may further include forming a second Ge layer on the first graphene, and forming a second graphene on the second Ge layer. Forming the second Ge layer on the first graphene may include forming a non-Ge layer on the first graphene using a non-Ge material, and forming a second Ge layer on the non-Ge layer.

The method may further include forming a multi-layer graphene by repeatedly stacking another Ge layer and another graphene on the second graphene. The method may further include forming a plurality of holes in the multi-layer graphene, and filling the plurality of holes with a functional material. The method may further include etching the first graphene and the second graphene according to a pattern.

Edges of the first graphene and the second graphene exposed by etching may be hydrogen-terminated or treated with functional groups. The method may further include forming a third graphene on side surfaces of the first graphene and the second graphene exposed by etching. The first Ge layer and the second Ge layer may be removed after the forming the third graphene. The first through third graphenes may be at least one of a one-atom layer, two-atom layers and three-atom layers.

The method of forming a graphene structure according to example embodiments facilitates to readily realize a three-dimensional shape of the graphene. The graphene structure can be used for realizing a three-dimensional shape of an electronic circuit, an electronic device, an optical device, or an energy device. Furthermore, the graphene structure can be used for realizing a nano-sized mechanical structure.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1A:
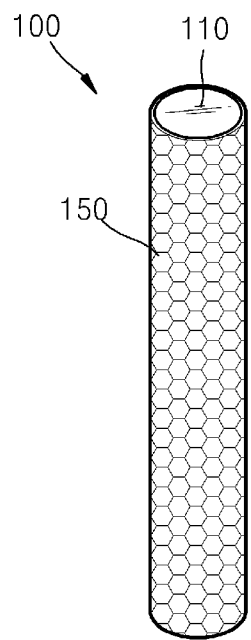
FIG. 1A is a schematic perspective view of a graphene structure according to example embodiments.

Reference will now be made in detail to embodiments, examples of which are illustrated in the accompanying drawings, wherein like reference numerals refer to the like elements throughout. In the drawings, like reference numerals refer to like elements throughout and lengths and sizes of layers and regions may be exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the present specification, the term "graphene" refers to poly-cyclic aromatic molecules formed of a two-dimensional (2D) carbon hexagonal plane, that is, a 2D thin film having a honeycomb structure formed by a covalent bond of a plurality of carbon atoms. The carbon atoms that are connected to each other through a covalent bond form a six-membered ring as a basic repeating unit. However, the structure of the carbon atoms may further include a five-membered ring and/or a seven-membered ring. Therefore, the graphene looks like a single layer of covalent-bonded ($sp^2$ hybridization) carbon atoms. The graphene may have various structures, and the structure varies according to the five-membered ring of the seven-membered ring included in the graphene. The graphene may be formed in a one-atom layer, or may be formed of multiple-atom layers by stacking a plurality of carbon atoms.

FIG. 1A is a schematic perspective view of a graphene structure 100 according to example embodiments. Referring to FIG. 1A, the graphene structure 100 may include a template 110 having a rod shape and a graphene 150 that surrounds an outer circumference of the template 110. The template 110 has a rod shape, and there is no specific limitation of size and material for forming the template 110. The template 110 may be a nanowire or a nanorod, e.g., a germanium nanowire or a silicon nanowire. In some cases, the template 110 may have a size in a range from about a few pm to about a few mm or more. In example embodiments, when the graphene structure 100 is used as a carrier for a functional material, the template 110 may include the functional material.

Figure 1B:
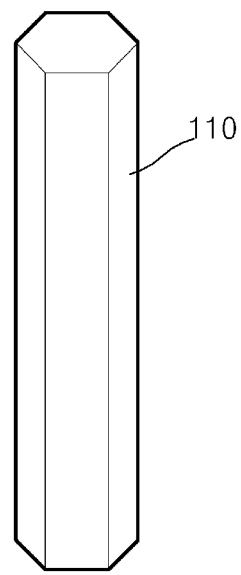
FIGS. 1B through 1D are perspective views showing modified examples of templates of the graphene structure of FIG. 1A.
Figure 1C:
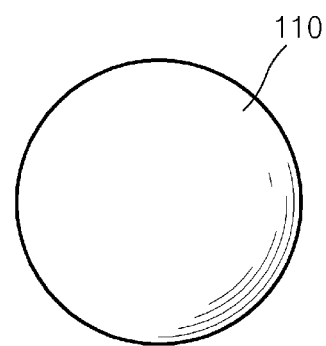
Figure 1D:
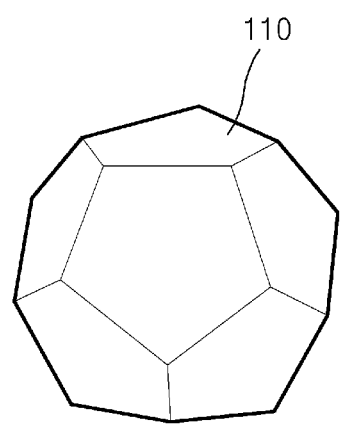

In FIG. 1A, the template 110 is depicted in a cylindrical shape, but is not limited thereto. For example, the template 110 may have various three-dimensional (3D) shapes, e.g., a polygonal column, a sphere, or a polyhedron as shown in FIGS. 1B through 1D.

The graphene 150 may not be tightly adhered to the template 110. For example, when the template 110 is formed of germanium Ge, because the graphene 150 is formed on the template 110, the graphene 150 may be tightly adhered to the template 110. However, the graphene structure 100 may be a hollow graphene tube formed of only the graphene 150 due to the removal of the template 110.

When the graphene 150 has a hollow tube shape, the appearance of the graphene 150 may be similar to a carbon nanotube. However, the graphene 150 may be different from the carbon nanotube in that the template 110 may interact with the graphene 150. Also, a typical carbon nanotube, e.g., a multi-walled carbon nanotube, has a diameter of about 100 nm or less. However, the graphene structure 100 according to example embodiments has no limitation in the size of its diameter. For example, the graphene structure 100 may be formed to a diameter from about 100 nm to about 1 mm. Also, the graphene structure 100 according to example embodiments may be formed to a diameter of about 100 nm or less. Also, because the graphene 150 depends on the shape of the template 110, when the template 110 is a polygonal column shape as shown in FIG. 1B, the cross-section of the graphene 150 may have a polygonal tube shape. For another example, when the template 110 is a sphere shape as shown in FIG. 1C, the graphene 150 may have a spherical shell shape. For another example, when the template 110 is a polyhedron shape as shown in FIG. 1D, the graphene 150 may have a polyhedral shell shape.

The graphene structure 100 as described above may be used for devices, sensors, or mechanical structures using the physical and chemical properties of the graphene. Also, because there is no limitation in the material for forming the template 110, the graphene structure 100 may also be used for protecting or transporting a predetermined or given functional material.

Figure 2A:
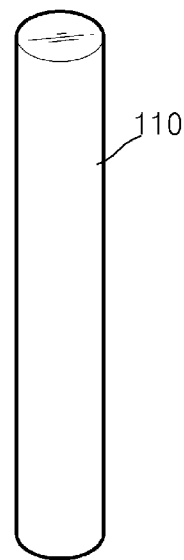
FIGS. 2A through 2D are perspective views showing an example method of forming the graphene structure of FIG. 1A, according to example embodiments.

FIGS. 2A through 2D are perspective views showing an example method of forming the graphene structure 100 of FIG. 1A, according to example embodiments. Referring to FIG. 2A, the template 110 formed of Ge may be prepared. For example, the template 110 may be a Ge nanowire or a monocrystal Ge rod. Also, the template 110 may have various 3D shapes, e.g., a polygonal column, a sphere, or a polygon (refer to FIGS. 1B through 1D).

Figure 2B:
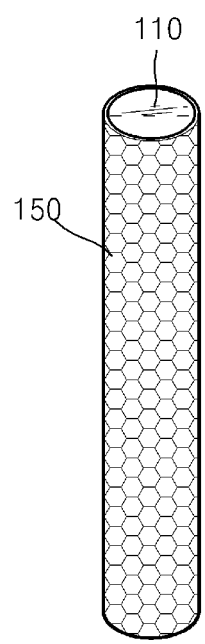
Figure 2C:
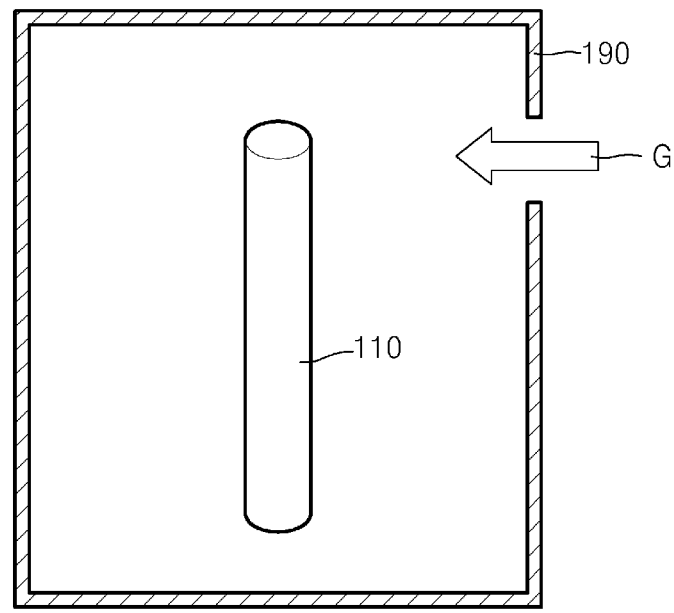

Referring to FIG. 2B, the graphene 150 may be grown on an outer circumference of the template 110. A practical method of forming a graphene using Ge has been disclosed in U.S. patent application Ser. No. 12/976,874, the entire contents of which are hereby incorporated by reference. For example, the graphene 150 may be formed on an outer circumference of the template 110 by using a chemical vapor deposition (CVD) method, that is, by injecting a carbon containing gas G into a reaction chamber 190 after placing the template 110 in the reaction chamber 190 as shown in FIG. 2C. More specifically, the carbon containing gas G may be $CH_4$, $C_2H_2$, $C_2H_4$, or CO.

The graphene 150 may be formed at a temperature in a range from about 200° C. to 1,100° C. under a chamber pressure in a range from about 0.1 torr to 760 torr for about 10 minutes to about 60 minutes. Ge has a relatively high eutectic temperature of about 937° C. with carbon, and the solubility limit of carbon in Ge may be about $10^8$ atom/cm$^3$, which is a relatively low level. That is, because the solubility of carbon is relatively low at a temperature in a range from about 700° C. to about 850° C. which is a typical graphene deposition temperature, carbon may be readily deposited from an outer circumference of the template 110, that is, Ge, and thus, may readily form the graphene 150 having a one-atom layer. Also, the graphene 150 having multi-atom layers, e.g., two-atom layers, three-atom layers, or more, may be formed by changing the deposition conditions.

As a conventional CVD method of forming graphene, a method of using a metal catalyst has been proposed. However, in the method of using a metal catalyst, the graphene may be contaminated due to insufficient removal of the metal catalyst after growing the graphene, or the graphene may be damaged when the metal catalyst is removed. Also, forming the graphene in a one-atom layer may be difficult because the metal catalyst has a relatively high solubility. However, in the method of forming the graphene according to example embodiments, a metal catalyst may not be used, and thus, the graphene may not be contaminated or damaged by any remaining metal catalyst. Therefore, the graphene 150 having a one-atom layer can be readily formed.

Figure 2D:
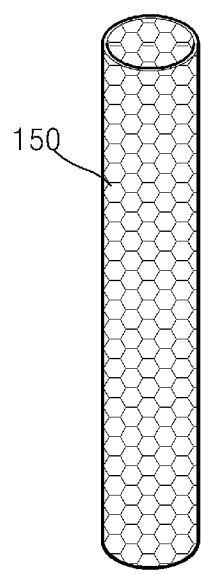

As depicted in FIG. 2D, the template 110 formed of Ge may be removed from the resultant product. In example embodiments, Ge may be easily dissolved in a liquid, e.g., water. Accordingly, the template 110 can be removed by soaking the template 110 on which the graphene 150 is grown, and thus, the graphene structure 100 formed of pure graphene 150 can be obtained. As described above, the diameter or the length of the template 110 is not specifically limited. Therefore, the diameter or the length of the graphene 150 formed by the method according to example embodiments is not limited.

Figure 3A:
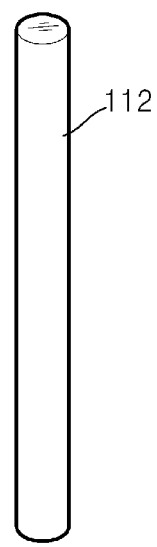
FIGS. 3A through 3D are perspective views showing another method of forming the graphene structure of FIG. 1A, according to example embodiments.

FIGS. 3A through 3D are perspective views showing another method of forming the graphene structure 100 of FIG. 1A, according to example embodiments. Referring to FIG. 3A, a template 112 may be prepared. The material for forming the template 112 is not specifically limited. For example, the template 112 may be formed of glass, sapphire, plastic, a metal, silicon, a silicon oxide, a semiconductor compound, or a composite material. The template 112 may be a nano structure, e.g., a nanowire or a nanorod, and may have a size in a range from about a few pm to about a few mm or more. As depicted in FIG. 3A, the template 112 may have a cylindrical shape, or various 3D shapes, e.g., a polygonal column, a sphere, or a polyhedron.

Figure 3B:
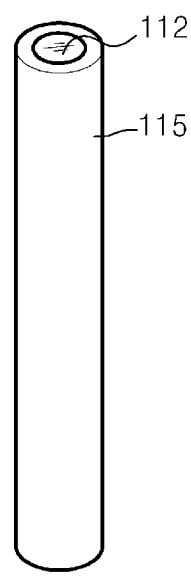

Referring to FIG. 3B, a Ge layer 115 may be deposited on an outer circumference of the template 112. For example, the Ge layer 115 may be formed by injecting a Ge containing gas, for example, $GeH_4$ or $GeCl_4$ into a reaction chamber (not shown) using a CVD method after placing the template 112 in the reaction chamber. The Ge layer 115 may be formed to a thickness in a range from about 10 nm to about 10 pm at a temperature in a range from about 200° C. to about 900° C. under a pressure in a range from about 1 torr to about 300 torr. The Ge layer 115 may be formed by an atomic layer deposition (ALD) method, a sputtering method, and an electron beam evaporation method besides the CVD method. The Ge layer 115 may be a mono-crystal layer or a multi-crystal layer.

Figure 3C:
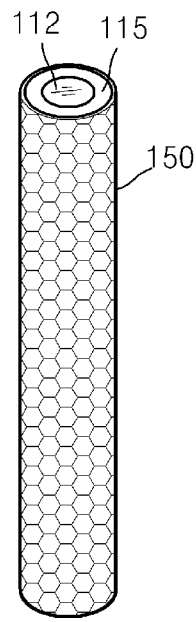

Referring to FIG. 3C, the graphene 150 may be grown on an outer circumference of the Ge layer 115. The method of forming the graphene 150 using the Ge layer 115 may be substantially the same as the method of forming the graphene 150 described with reference to FIG. 2B.

Figure 3D:
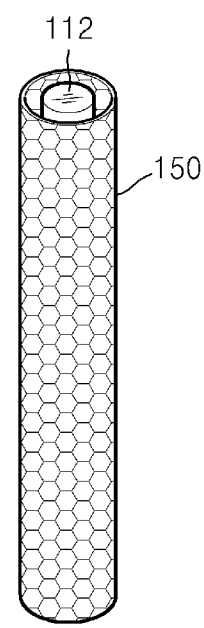

As depicted in FIG. 3D, only the template 112 in the graphene 150 may remain by removing the Ge layer 115. At this point, the graphene structure 100 may include the template 112 and the graphene 150 that surrounds the template 112. As described above, because there is no specific limitation in the material for forming the template 112, the material for forming the template 112 may be selected as necessary.

When the processes described with reference to FIGS. 3B and 3C are repeated, a structure in which multiple layers of the Ge layer 115 and the graphene 150 that surround the outer circumference of the template 112 having a rod shape may be formed. Also, when the Ge layer 115 is removed, a structure in which multiple layers of the graphene 150 that surround the template 112 having a rod shape may be formed. Each layer of the graphene 150 may be formed in a one-atom layer because the graphene 150 may be formed using Ge.

Also, each layer of the graphene 150 may have two-atom layers or three-atom layers. After forming the graphene 150 as shown in FIG. 3C and coating an outer circumference of the graphene 150 with a non-Ge material, a non-Ge material layer may be formed between multi-layers of graphene while the multiple layers of graphene having a cylindrical shape are formed by performing the processes described with reference to FIGS. 3B and 3C.

Figure 4:
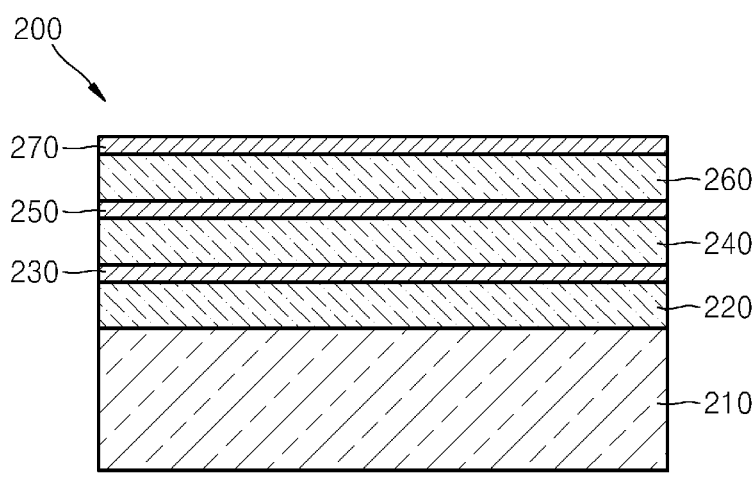
FIG. 4 is a schematic cross-sectional view of a graphene structure according to example embodiments.

FIG. 4 is a schematic cross-sectional view of a graphene structure 200 according to example embodiments. Referring to FIG. 4, the graphene structure 200 has a stack structure in which a first Ge layer 220, a first graphene 230, a second Ge layer 240, a second graphene 250, a third Ge layer 260, and a third graphene 270 may be sequentially formed on a substrate 210. The material for forming the substrate 210 is not specifically limited. When the substrate 210 is formed of Ge, the first Ge layer 220 may be omitted. Each of the first through third graphenes 230, 250, and 270 may be formed in a one-atom layer, and also may be formed of multi-atom layers, e.g., two-atom layers, three-atom layers or more. When it is considered that typically the graphene is formed in a 2D sheet, the graphene structure in which graphene is stacked as in the graphene structure 200 according to example embodiments may be understood as a 3D shape.

In example embodiments, the graphene structure 200 having three layers of graphene is described as an example. However, the graphene structure 200 according to example embodiments may have a multi-layer graphene structure in which two layers of graphene or more than four layers of graphene are stacked.

Figure 5:
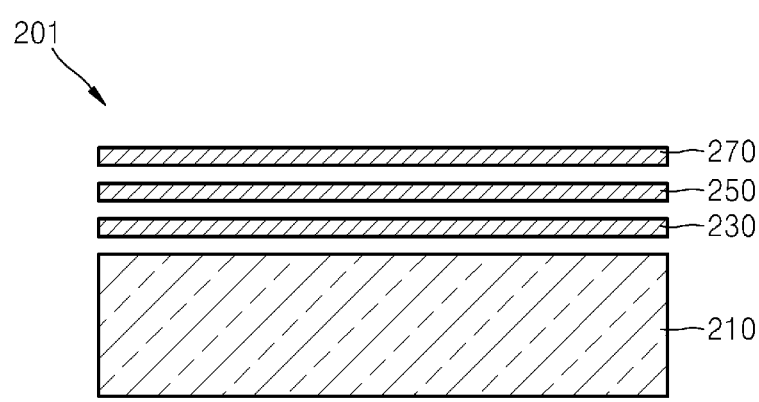
FIG. 5 is a schematic cross-sectional view of a modified version of the graphene structure of FIG. 4.

FIG. 5 is a schematic cross-sectional view of a modified version of the graphene structure 200 of FIG. 4. Referring to FIG. 5, a graphene structure 201 according to the modified version has a structure in which the first through third Ge layers 220, 240, and 260 may be removed from the graphene structure 200 of FIG. 4, and thus, the graphene 230, 250, and 270 remain. The substrate 210 may also be removed from the first through third graphene 230, 250, and 270 (not shown). The graphene structure 201 according to the modified version has a structure in which the number of atom-layers can be precisely controlled, e.g., the first through third graphene 230, 250, and 270.

Figure 6:
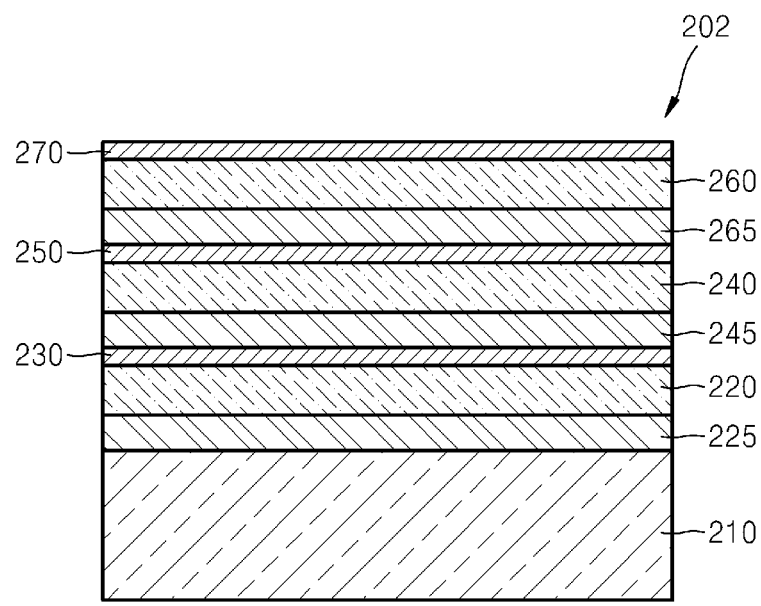
FIG. 6 is a schematic cross-sectional view of another modified version of the graphene structure of FIG. 4.

FIG. 6 is a schematic cross-sectional view of another modified version of the graphene structure 200 of FIG. 4. Referring to FIG. 6, a graphene structure 202 according to the modified version has a structure in which first through third non-Ge layers 225, 245, and 265 may be additionally included in the graphene structure 200 of FIG. 4. The first non-Ge layer 225 may be interposed between the substrate 210 and the first Ge layer 220, the second non-Ge layer 245 may be interposed between the first graphene 230 and the second Ge layer 240, and the third non-Ge layer 265 may be interposed between the second graphene 250 and the third Ge layer 260.

In a process which will be described later, because the first through third non-Ge layers 225, 245, and 265 are not related to the formation of graphene, the materials for forming the first through third non-Ge layers 225, 245, and 265 are not specifically limited. All of the first through third non-Ge layers 225, 245, and 265 may be formed of the same material or may be formed of materials that are different from each other. The first through third non-Ge layers 225, 245, and 265 may be formed of, for example, glass, sapphire, plastic, a metal, silicon, a silicon oxide, a Group III-V semiconductor compound, or a composite material.

Figure 7:
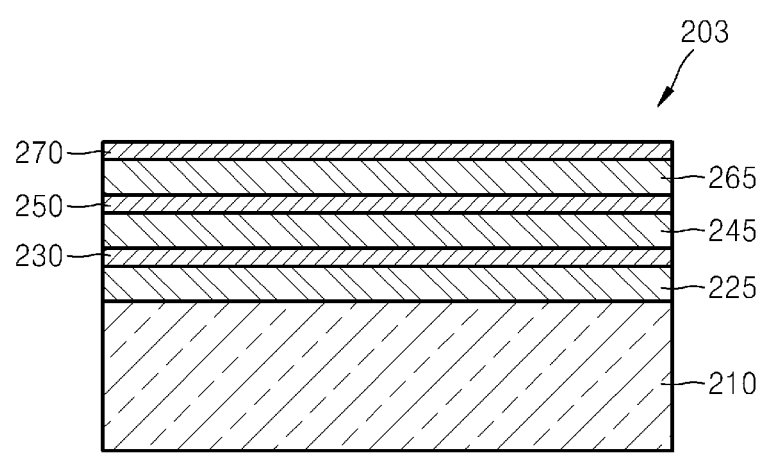
FIG. 7 is a schematic cross-sectional view of another modified version of the graphene structure of FIG. 4.

FIG. 7 is a schematic cross-sectional view of another modified version of the graphene structure 200 of FIG. 4. Referring to FIG. 7, a graphene structure 203 according to the modified version has a structure in which the first through third Ge layers 220, 240, and 260 may be removed from the graphene structure 202 of FIG. 6, and thus, the first through third graphene 230, 250, and 270 and the first through third non-Ge layers 225, 245, and 265 remain on the substrate 210. Because the graphene structure 203 has a multi-layer structure in which the first through third graphene 230, 250, and 270 and the first through third non-Ge layers 225, 245, and 265 are alternately stacked, the graphene structure 203 is understood as a super-lattice structure.

The graphene structures 200, 201, 202, and 203 have a very similar structure to a typical semiconductor device, and thus, may be readily applied to various electronic devices, optical devices, and energy devices that may utilize graphene.

FIGS. 8A through 8E are cross-sectional views showing an example method of forming the graphene structure 200 of FIG. 4 or the graphene structure 201 of FIG. 5.

Figure 8A:
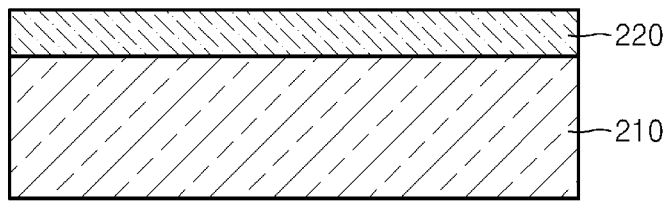
FIGS. 8A through 8E are cross-sectional views showing an example method of forming the graphene structure of FIG. 5.

Referring to FIG. 8A, the first Ge layer 220 may be formed on the substrate 210 to a thickness, for example, in a range from about 10 nm to about 10 μm. As described with reference to FIG. 3B, the first Ge layer 220 may be formed on the substrate 210 by using a CVD method. Besides using the CVD method, the first Ge layer 220 may also be formed by using an atomic layer deposition (ALD) method, a sputtering method, or an electron beam evaporation method. In example embodiments, the substrate 210 may be formed of Ge. In example embodiments, the first Ge layer 220 may be an upper surface of the substrate 210.

Figure 8B:
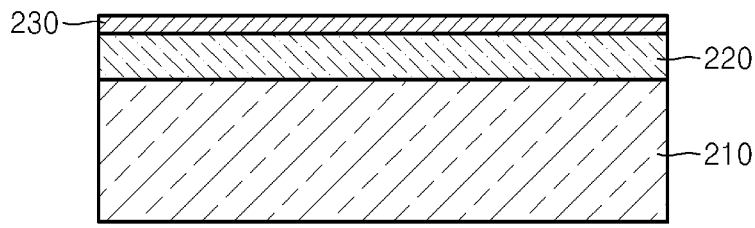

Referring to FIG. 8B, the first graphene 230 may be grown on an upper surface of the first Ge layer 220. The method of growing the first graphene 230 using the first Ge layer 220 may be substantially the same as the method described with reference to FIG. 2B.

Figure 8C:
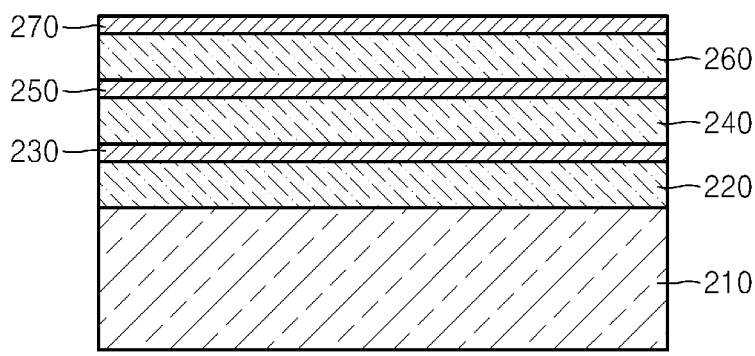

As described above, the process of growing graphene using Ge may be repeatedly performed. As a result, as shown in FIG. 8C, multi-layers of graphene may be formed by sequentially stacking the first Ge layer 220, the first graphene 230, the second Ge layer 240, the second graphene 250, the third Ge layer 260, and the third graphene 270 on the substrate 210.

In case of a conventional method of growing graphene, after forming the graphene, the graphene may be mechanically or chemically exfoliated in order to be utilized. However, in the method of forming a graphene according to example embodiments, the graphene can be directly stacked, and thus, a multi-layer graphene structure, which is difficult to realize by using the conventional method, can be realized.

Figure 8D:
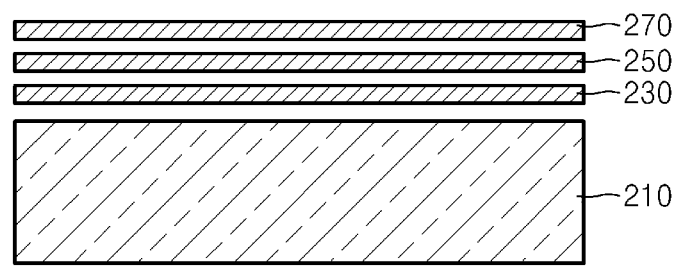
Figure 8E:
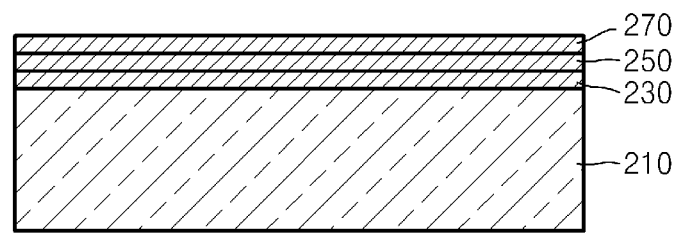

As depicted in FIG. 8D, the first through third Ge layers 220, 240, and 260 may be removed from the resultant product. As depicted in FIG. 8E, the first through third graphenes 230, 250, and 270 remain on the substrate 210. In example embodiments, the graphene structure may be formed of multi-layer graphene formed of the first through third graphenes 230, 250, and 270 on the substrate 210.

Each of the first through third graphenes 230, 250, and 270 may be formed in a one-atom layer, and thus, the number of atom-layers can be precisely controlled, e.g., the first through third graphenes 230, 250, and 270 in the graphene structure 200. If necessary, each of the first through third graphenes 230, 250, and 270 may be formed in multi-atom layers, e.g., two-atom layers, three-atom layers or more.

Figure 9A:
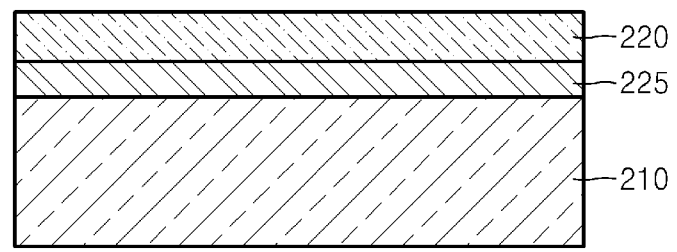
FIGS. 9A through 9E are cross-sectional views showing an example method of forming the graphene structure of FIG. 6.

FIGS. 9A through 9E are cross-sectional views showing an example method of forming the graphene structure 202 of FIG. 6 or the graphene structure 203 of FIG. 7. Referring to FIG. 9A, the first non-Ge layer 225 may be formed on the substrate 210, and the first Ge layer 220 may be formed on the first non-Ge layer 225. The first non-Ge layer 225 may be formed of any material except Ge.

For example, the first non-Ge layer 225 may be formed of glass, sapphire, plastic, a metal, silicon, a silicon oxide, a semiconductor compound, or a composite material. The first non-Ge layer 225 may be formed by using a CVD method, an ALD method, a sputtering method, or an electron beam evaporation method based on the material for forming the first non-Ge layer 225.

Figure 9B:
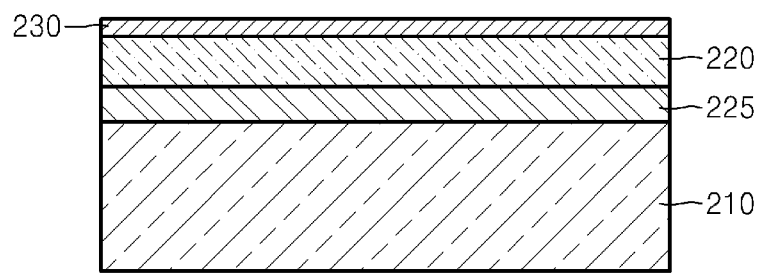

Referring to FIG. 9B, the first graphene 230 may be formed on an upper surface of the first Ge layer 220. The method of growing the first graphene 230 by using the first Ge layer 220 may be substantially the same as the method described with reference to FIG. 2B.

Figure 9C:
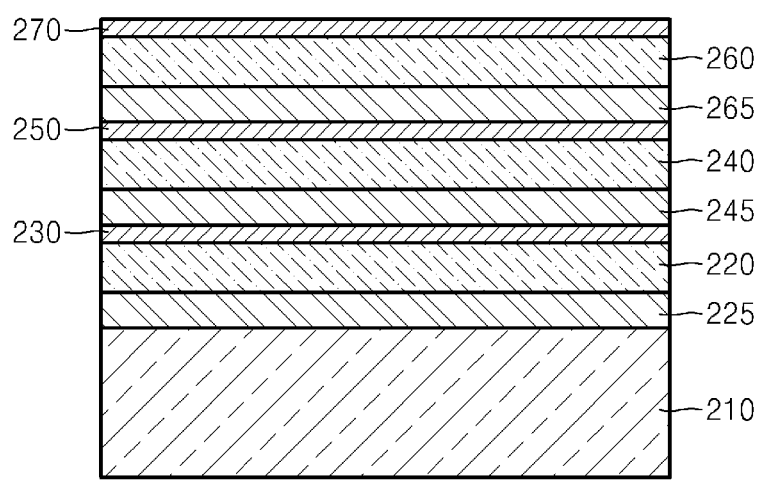

As described above, the process of growing graphene by using Ge may be repeatedly performed. As a result, as shown in FIG. 9C, multi-layers of graphene may be formed by sequentially stacking the first non-Ge layer 225, the first Ge layer 220, the first graphene 230, the second non-Ge layer 245, the second Ge layer 240, the second graphene 250, the third non-Ge layer 265, the third Ge layer 260, and the third graphene 270 on the substrate 210. The first through third non-Ge layers 225, 245, and 265 may be formed of the same material, or may also be formed of materials that are different from each other.

Figure 9D:
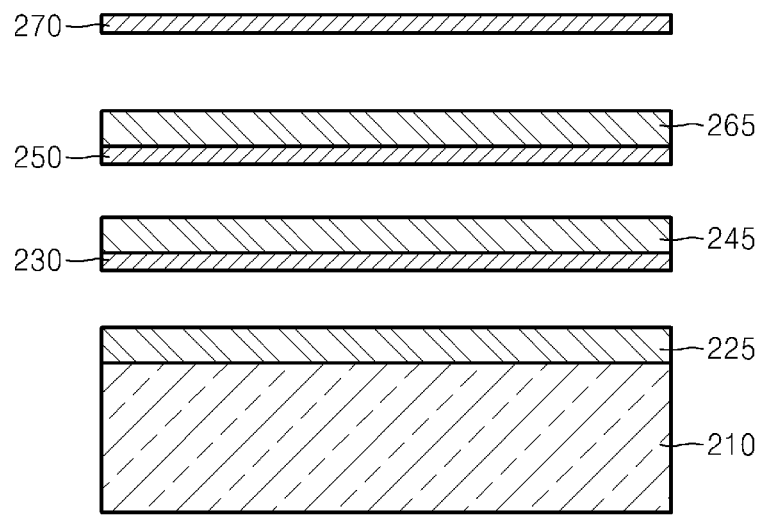
Figure 9E:
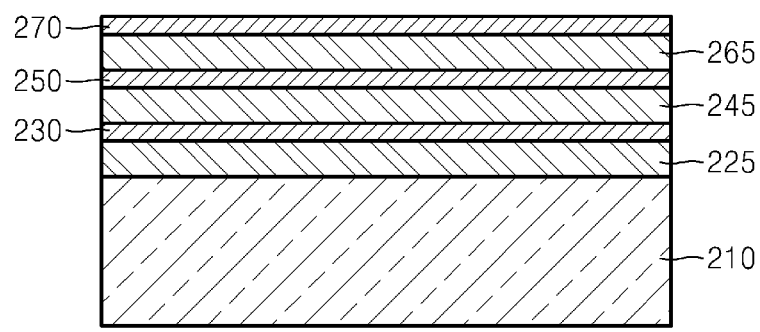

As depicted in FIG. 9D, the first through third Ge layers 220, 240, and 260 may be removed. Thus, as depicted in FIG. 9E, a super-lattice structure in which the first through third graphenes 230, 250, and 270 and the first through third non-Ge layers 225, 245, and 265 are alternately stacked on the substrate 210 may be formed.

Figure 10:
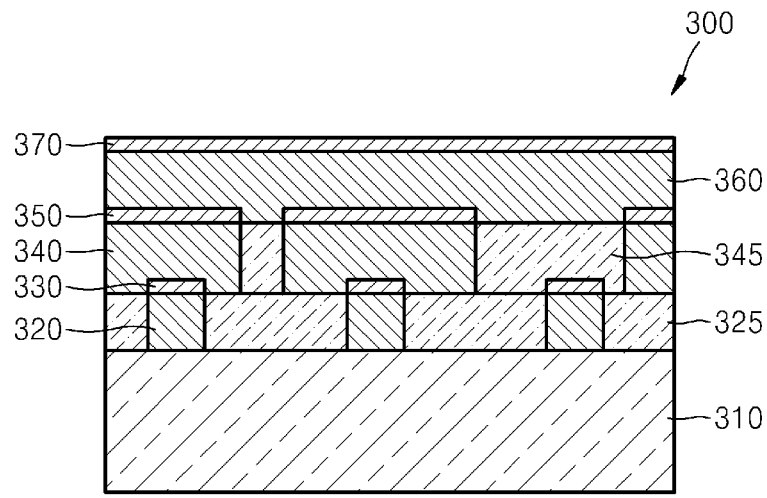
FIG. 10 is a schematic cross-sectional view of a graphene structure according to example embodiments.
Figure 11A:
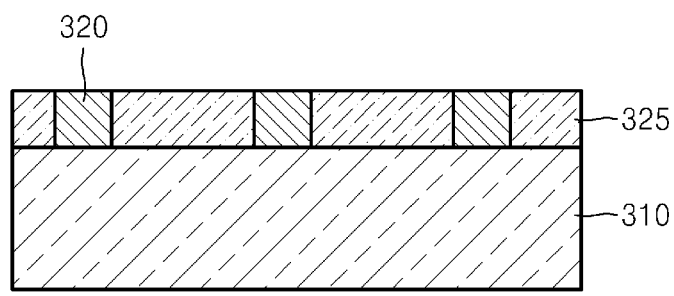
FIGS. 11A through 11D are cross-sectional views showing an example method of forming the graphene structure of FIG. 10.
Figure 11B:
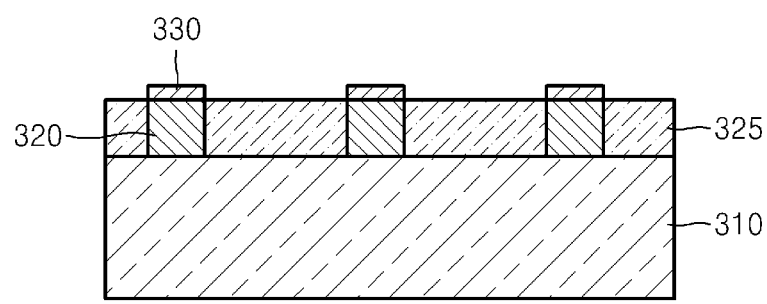

FIG. 10 is a schematic cross-sectional view of a graphene structure 300 according to example embodiments. FIGS. 11A through 11D are cross-sectional views showing an example method of forming the graphene structure 300 of FIG. 10. Referring to FIGS. 10 and 11A, a first Ge layer 320 having a predetermined or given pattern may be formed on a substrate 310. Regions 325 where the first Ge layer 320 is not formed may be filled with a material, e.g., silicon, on which the graphene does not grow. Referring to FIGS. 10 and 11B, a first graphene 330 may be formed on the first Ge layer 320. Thus, the first graphene 330 has a pattern substantially the same as that of the first Ge layer 320.

Figure 11C:
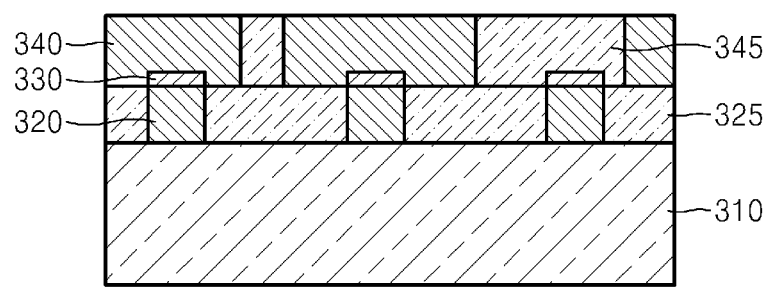

Referring to FIGS. 10 and 11C, a second Ge layer 340 having a predetermined or given pattern may be formed on a layer on which the first graphene 330 is formed. Regions 345 where the first Ge layer 340 is not formed may be filled with a material, e.g., silicon, on which the graphene does not grow. The first graphene 330 may be formed of a one-atom layer or few-atom layers, and thus, the thickness of the first graphene 330 may be negligible.

Figure 11D:
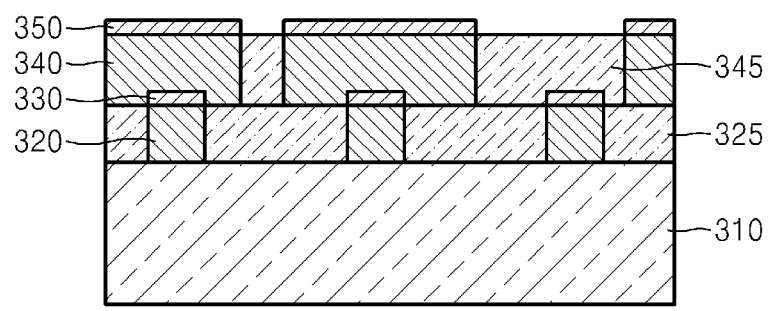

Referring to FIGS. 10 and 11D, a second graphene 350 may be formed on the second Ge layer 340. The second graphene 350 has a pattern substantially the same as that of the first Ge layer 340. In the same manner, a third Ge layer 360 (refer to FIG. 10) and a third graphene 370 (refer to FIG. 10) may also be formed on a layer on which the second graphene 350 is formed.

The graphene structure 300 having the above structure as depicted in FIG. 10 has a stacking structure in which the first through third graphene 330, 350, and 370 may be stacked. The patterns of each of the first through third graphene 330, 350, and 370 may be used to realize functions or wiring-circuits of predetermined or given electronic devices.

In example embodiments, the graphene structure 300 having three layers of graphene may be described as an example. However, the graphene structure 300 according to example embodiments may have a multi-layer graphene structure in which two layers of graphene or more than four layers of graphene may be stacked.

Figure 12:
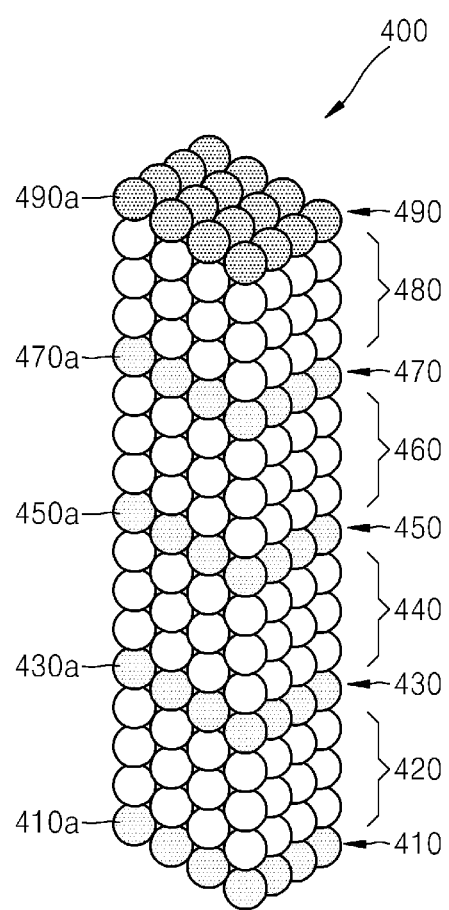
FIG. 12 is a perspective view of a graphene structure according to example embodiments.

FIG. 12 is a perspective view of a graphene structure 400 according to example embodiments. The graphene structure 400 according to example embodiments may have a stacked-column in which first through fourth supporting layers 420, 440, 460 and 480 and first through fourth graphenes 430, 450, 470 and 490 may be alternately stacked on a substrate 410. The stack-column may be a modified version of the graphene structure 200 described with reference to FIG. 4 or the graphene structure 203 described with reference to FIG. 7. That is, the graphene structure 400 according to example embodiments may be a structure formed by etching all regions of the graphene structures 200 and 203 except a predetermined or given region.

Edges 430a, 450a, 470a and 490a of the first through fourth graphenes 430, 450, 470 and 490 and edge 410a of the substrate may be respectively exposed to the external environment. The materials for forming the first through fourth supporting layers 420, 440, 460 and 480 are not specifically limited. For example, as in the graphene structure 200 described with reference to FIG. 4, the first through fourth supporting layers 420, 440, 460 and 480 may be formed of Ge.

Alternatively, as in the graphene structure 203 described with reference to FIG. 7, the first through fourth supporting layers 420, 440, 460 and 480 may be formed of a non-Ge material. The edges 430a, 450a, 470a and 490a of the first through fourth graphenes 430, 450, 470 and 490 and the edge 410a of the substrate exposed to the external environment may have an arm-chair shape or a zigzag shape according to a cutaway shape due to the etching. The edges 410a, 430a, 450a, 470a and 490a may be hydrogen-terminated (H-terminated) or treated with predetermined or given functional groups.

Figure 13:
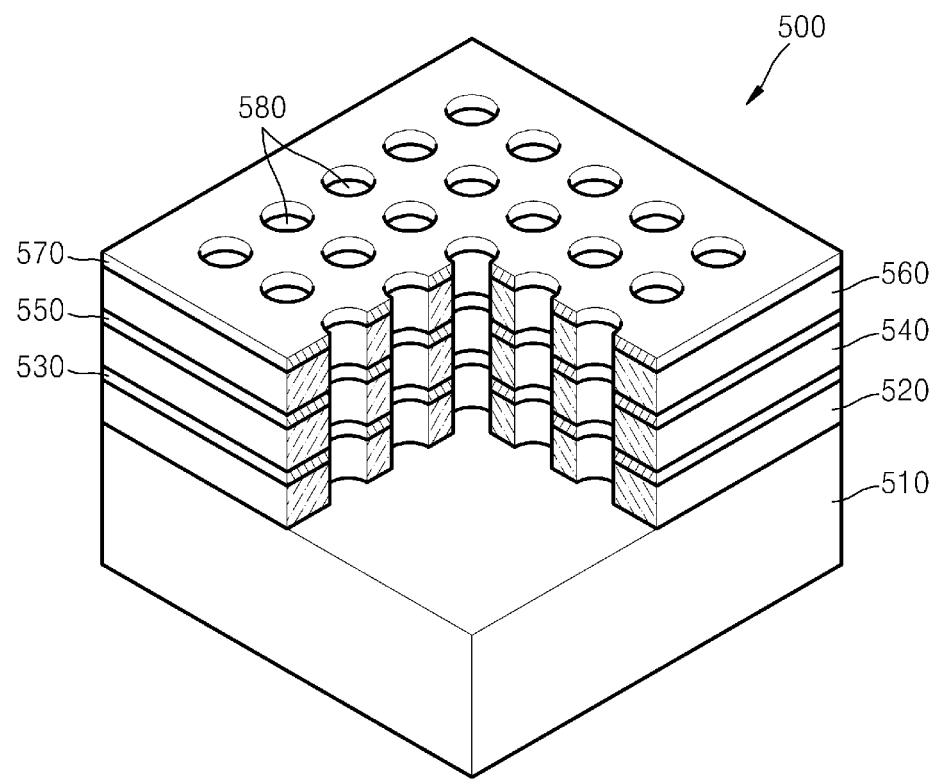
FIG. 13 is a schematic cutaway perspective view of a graphene structure according to example embodiments.

FIG. 13 is a schematic cutaway perspective view of a graphene structure 500 according to example embodiments. The graphene structure 500 may be a modified version of the graphene structure 200 described with reference to FIG. 4 or the graphene structure 203 described with reference to FIG. 7.

That is, the graphene structure 500 according to example embodiments may have a porous multi-layer graphene structure in which a plurality of holes 580 may be formed in multi-layer graphene formed by alternately stacking first through third supporting layers 520, 540, and 560 and first through third graphenes 530, 550, and 570 on a substrate 510.

In FIG. 13, the holes 580 have a circular shape. However, the shape of the holes 580 according to example embodiments is not limited thereto. That is, the holes 580 may have a polygonal shape or any other shape. A functional material may be injected into the holes 580. For example, when the holes 580 have a size in a range from a few nm to a few tens of nm, a material, e.g., quantum dot phosphor, may be injected into the holes 580.

Figure 14:
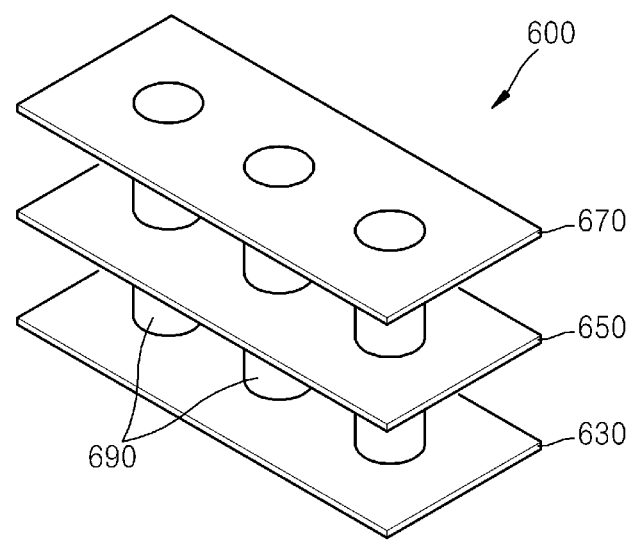
FIG. 14 is a perspective view of a graphene structure according to example embodiments.
Figure 15A:
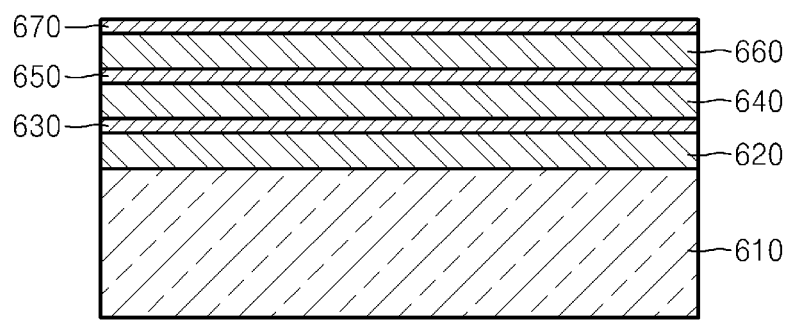
FIGS. 15A through 15D are cross-sectional views showing an example method of forming the graphene structure of FIG. 14.

FIG. 14 is a schematic perspective view of a graphene structure 600 according to example embodiments. FIGS. 15A through 15D are cross-sectional views showing an example method of forming the graphene structure 600 of FIG. 14. Referring to FIG. 15A, a multi-layer graphene may include first through third Ge layers 620, 640, and 660 and first through third graphenes 630, 650, and 670 alternately stacked on a substrate 610. The multi-layer graphene may be the graphene structure 200 described with reference to FIG. 4.

Figure 15B:
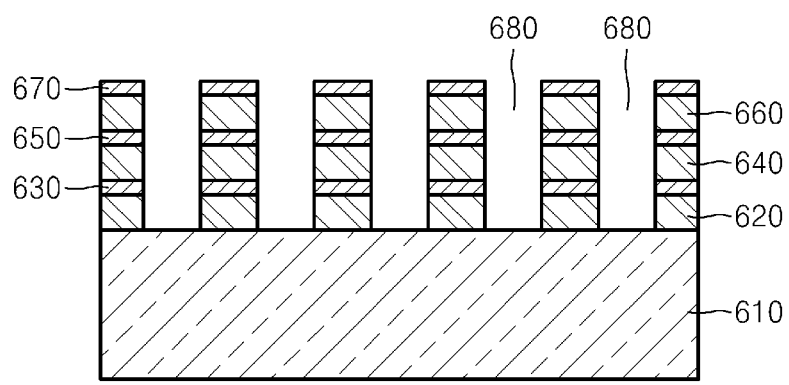

Referring to FIG. 15B, the multi-layer graphene may be etched to a predetermined or given pattern. Side surfaces of each of the first through third Ge layers 620, 640, and 660 and an edge of each of the first through third graphenes 630, 650, and 670 may be exposed to the external environment on side surfaces of etched regions 680.

Figure 15C:
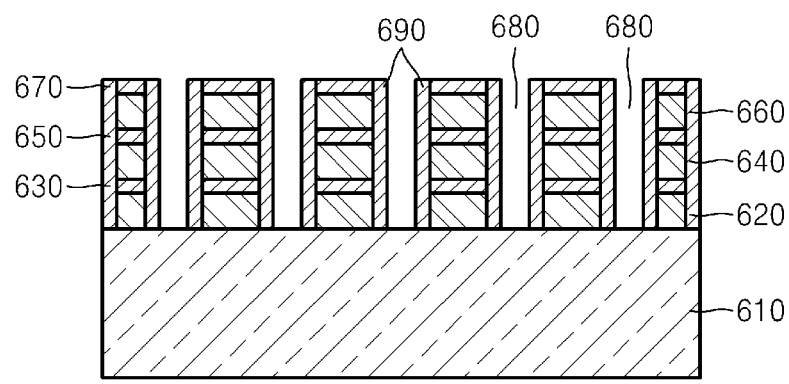

Referring to FIG. 15C, a side graphene 690 may be formed on the side surfaces of each of the exposed first through third Ge layers 620, 640, and 660. The side graphene 690 may be connected to the edge of each of the first through third graphenes 630, 650, and 670 which are exposed in the etched regions 680. Thus, a 3D shape formed of the side surfaces of the first through third graphene 630, 650, and 670 and the side graphene 690 may be realized.

Figure 15D:
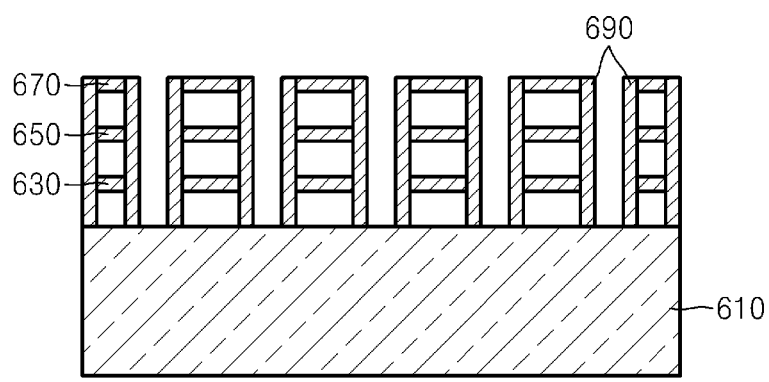

As depicted in FIG. 15D, the first through third Ge layers 620, 640, and 660 may be removed from the resultant product. Even though not illustrated, the side graphene 690 may not be formed on portions of the side surfaces of the first through third Ge layers 620, 640, and 660. When the first through third Ge layers 620, 640, and 660 are removed as described above, a 3D structure formed of only the first through third graphene 630, 650, and 670 and the side graphene 690 may be realized. When the substrate 610 is removed, a 3D structure formed of pure graphene may be realized.

The structures described above are example 3D shapes realized by graphene. Also, various 3D shapes may be realized by limiting the regions on which the side graphene 690 is formed, by forming each of the first through third graphene 630, 650, and 670 in a predetermined or given pattern, or by applying the methods described in example embodiments. The graphene having a 3D shape may be used for realizing a 3D device, e.g., an electronic circuit, an electronic device, an optical device, or an energy device, and furthermore, used for realizing a nano-sized mechanical structure.

In example embodiments, the graphene structure 600 having three layers of graphene is merely an example. The graphene structure 600 according to example embodiments may have a multi-layer graphene structure in which two layers of graphene or more than four layers of graphene may be stacked.

While the graphene structure and the method of forming the same have been particularly shown and described with reference to example embodiments thereof, it will be understood by those of ordinary skill in the art that various changes in form and details may be made therein without departing from the spirit and scope of the following claims.

What is claimed is:

1. A graphene structure comprising:
   a first supporting layer;
   a first graphene on the first supporting layer;
   a second supporting layer on the first graphene; and
   a second graphene on the second supporting layer,
   wherein the first and second supporting layers are formed of Ge or include a Ge coating on upper surfaces thereof, and
   wherein the first supporting layer, the first graphene, the second supporting layer, and the second graphene are stacked.

2. The graphene structure of claim 1, wherein at least one of the first graphene and the second graphene is patterned.

3. The graphene structure of claim 1, further comprising:
   a third supporting layer on the second graphene; and
   a third graphene on the third supporting layer to form a multi-layer graphene structure.

4. The graphene structure of claim 3, wherein the multi-layer graphene structure includes a plurality of holes therein.

5. A method of forming a graphene structure, the method comprising:
   placing a three dimensional (3D) template in a reaction chamber, the 3D template including a first Ge layer on an upper surface of the 3D template;
   growing a first graphene along at least a portion of an outer circumference of the template;
   forming a second Ge layer on the first graphene; and
   forming a second graphene on the second Ge layer,
   wherein the first Ge layer, the first graphene, the second Ge layer, and the second graphene are stacked, and
   wherein the 3D shape of the template is any one of a polygonal column, a sphere, or a polyhedron.

6. The method of claim 5, wherein the first Ge layer is removed after forming the first graphene.

7. The method of claim 5, wherein the first Ge layer is formed according to a pattern and the first graphene is grown along the pattern of the first Ge layer.

8. The method of claim 5, wherein forming the second Ge layer on the first graphene comprises:
   forming a non-Ge layer on the first graphene using a non-Ge material; and
   forming a second Ge layer on the non-Ge layer.

9. The method of claim 5, further comprising:
   forming a multi-layer graphene by repeatedly stacking another Ge layer and another graphene on the second graphene.

10. The method of claim 9, further comprising:
    forming a plurality of holes in the multi-layer graphene; and
    filling the plurality of holes with a functional material.

11. The method of claim 5, further comprising:
    etching the first graphene and the second graphene according to a pattern.

12. The method of claim 11, wherein edges of the first graphene and the second graphene exposed by etching are hydrogen-terminated or treated with functional groups.

13. The method of claim 11, further comprising:
    forming a third graphene on side surfaces of the first graphene and the second graphene exposed by etching.

14. The method of claim 13, wherein the first Ge layer and the second Ge layer are removed after the forming the third graphene.

15. The method of claim 5, wherein the first graphene is at least one of a one-atom layer, two-atom layers and three-atom layers.

* * * * *